United States Patent
Wang et al.

(10) Patent No.: US 8,730,786 B2
(45) Date of Patent: May 20, 2014

(54) REMOTE RADIO HEAD UNIT SYSTEM WITH WIDEBAND POWER AMPLIFIER AND METHOD

(75) Inventors: Chengxun Wang, Shenzhen (CN); Shawn Patrick Stapleton, Burnaby (CA)

(73) Assignee: Dali Systems Co. Ltd., George Town Grand Cayman (KY)

( * ) Notice: Subject to any disclaimer, the term of this patent is extended or adjusted under 35 U.S.C. 154(b) by 627 days.

(21) Appl. No.: 12/928,933

(22) Filed: Dec. 21, 2010

(65) Prior Publication Data
US 2011/0158081 A1    Jun. 30, 2011

Related U.S. Application Data

(60) Provisional application No. 61/288,840, filed on Dec. 21, 2009.

(51) Int. Cl.
*H04J 1/12*    (2006.01)

(52) U.S. Cl.
USPC ............................ 370/201; 375/285; 455/78

(58) Field of Classification Search
None
See application file for complete search history.

(56) References Cited

U.S. PATENT DOCUMENTS

| | | | |
|---|---|---|---|
| 4,638,248 | A | 1/1987 | Schweickert |
| 5,678,198 | A | 10/1997 | Lemson |
| 5,757,229 | A | 5/1998 | Mitzlaff |
| 6,246,286 | B1 | 6/2001 | Persson |
| 6,301,579 | B1 | 10/2001 | Becker |
| 6,424,225 | B1 | 7/2002 | Choi et al. |
| 6,625,429 | B1 | 9/2003 | Yamashita |
| 6,747,649 | B1 | 6/2004 | Sanz-Pastor et al. |
| 6,751,447 | B1 | 6/2004 | Jin et al. |
| 7,102,442 | B2 | 9/2006 | Anderson |
| 7,109,998 | B2 | 9/2006 | Smith |
| 7,362,125 | B2 | 4/2008 | Gupta et al. |
| 7,372,918 | B2 | 5/2008 | Muller et al. |
| 7,535,298 | B2 | 5/2009 | Sihlbom et al. |
| 7,542,518 | B2 | 6/2009 | Kim et al. |
| 7,583,754 | B2 | 9/2009 | Liu |
| 7,593,450 | B2 | 9/2009 | Conyers et al. |

(Continued)

FOREIGN PATENT DOCUMENTS

| | | |
|---|---|---|
| EP | 1746720 | 1/2007 |
| WO | WO0108297 | 2/2001 |
| WO | WO2008154077 | 12/2008 |
| WO | WO 2011/077249 A2 | 6/2011 |

OTHER PUBLICATIONS

Kim et al., "Adaptive Feedback Interference Cancellation System", 2003 IEEE MTT-S International Microwave Symposium Digest, 1:627-630, Jun. 13, 2003, 3 pages.

(Continued)

*Primary Examiner* — Kevin C Harper
(74) *Attorney, Agent, or Firm* — Kilpatrick Townsend & Stockton LLP

(57) ABSTRACT

A remote radio head unit (RRU) system for multiple operating frequency bands, multi-channels, driven by a single or more wide band power amplifiers. More specifically, the present invention enables multiple-bands RRU to use fewer power amplifiers in order to reduce size and cost of the multi-band RRU. The present invention is based on the method of using duplexers and/or interference cancellation system technique to increase the isolation between the transmitter signal and receiver signal of the RRU.

19 Claims, 6 Drawing Sheets

FDD Modulation Agnostic Dual Band RRU with Interference Cancellation System

(56) References Cited

U.S. PATENT DOCUMENTS

| | | |
|---|---|---|
| 7,606,324 B2 | 10/2009 | Cai et al. |
| 7,831,221 B2 | 11/2010 | Leffel et al. |
| RE42,287 E | 4/2011 | Apodaca et al. |
| 8,014,745 B1 * | 9/2011 | Ho et al. ............... 455/278.1 |
| 2002/0072344 A1 * | 6/2002 | Souissi .................... 455/296 |
| 2003/0054760 A1 * | 3/2003 | Karabinis ................ 455/12.1 |
| 2003/0179829 A1 | 9/2003 | Pinckley et al. |
| 2005/0079834 A1 | 4/2005 | Maniwa et al. |
| 2005/0226353 A1 * | 10/2005 | Gebara et al. ............ 375/346 |
| 2005/0262498 A1 | 11/2005 | Ferguson et al. |
| 2006/0012426 A1 | 1/2006 | Nezami |
| 2006/0045054 A1 * | 3/2006 | Utsumi et al. ........... 370/338 |
| 2006/0270366 A1 | 11/2006 | Rozenblit et al. |
| 2007/0075780 A1 | 4/2007 | Krvavac et al. |
| 2007/0171234 A1 | 7/2007 | Crawfis et al. |
| 2009/0146736 A1 | 6/2009 | Kim et al. |
| 2009/0163156 A1 | 6/2009 | Rofougaran et al. |
| 2009/0232191 A1 | 9/2009 | Gupta et al. |
| 2011/0007623 A1 * | 1/2011 | Cendrillon et al. ......... 370/201 |

OTHER PUBLICATIONS

International Search Report for International Application No. PCT/IB2010/003452 mailed on Jun. 9, 2011, 2 pages.

CA2616323A1 (Chan et al.) Dec. 21, 2007 Abstract; paragraphs 0003-0005; 0025-0030; 0043-0055, Fig.3.

\* cited by examiner

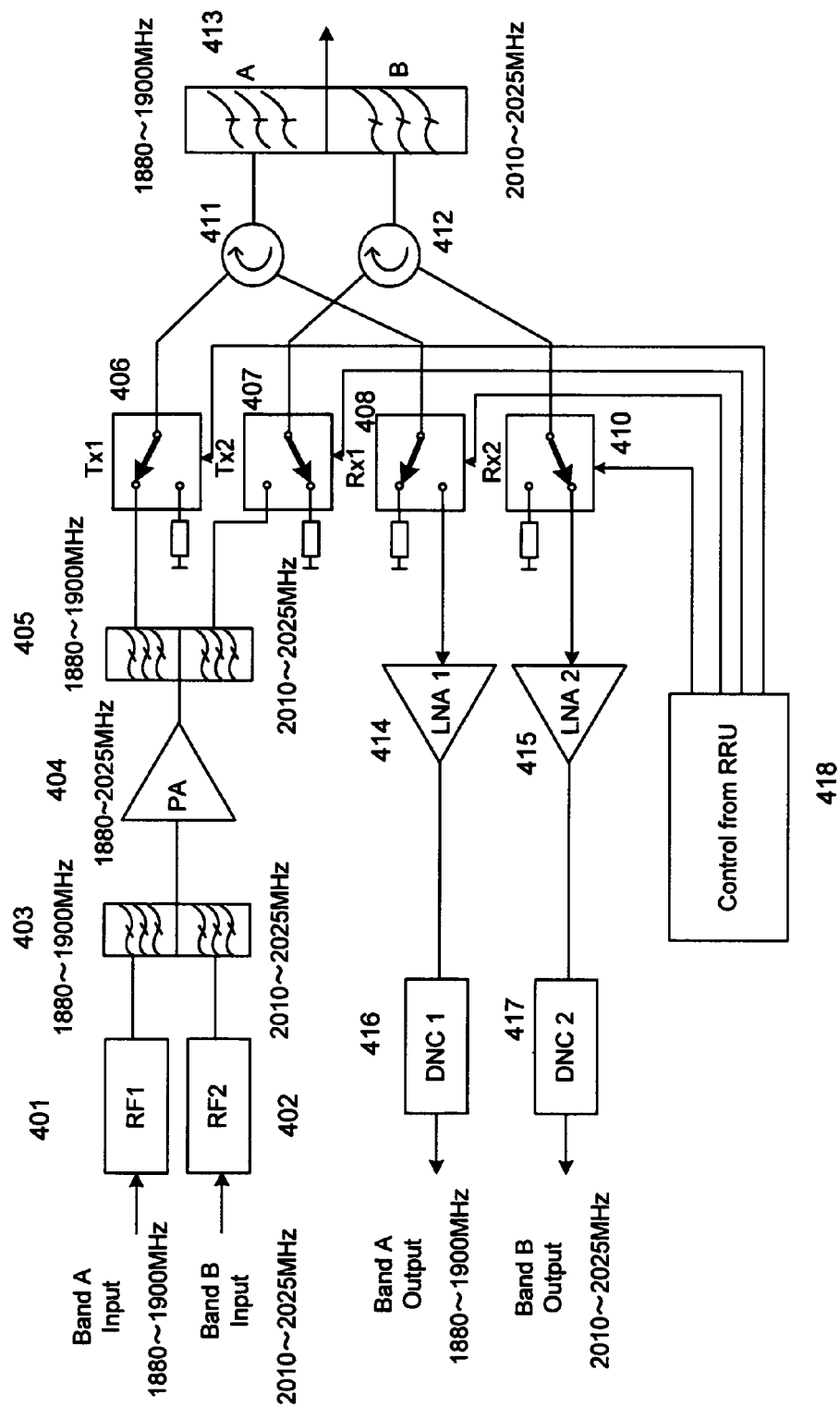
Figure 1: Dual Band TD-SCDMA RRU

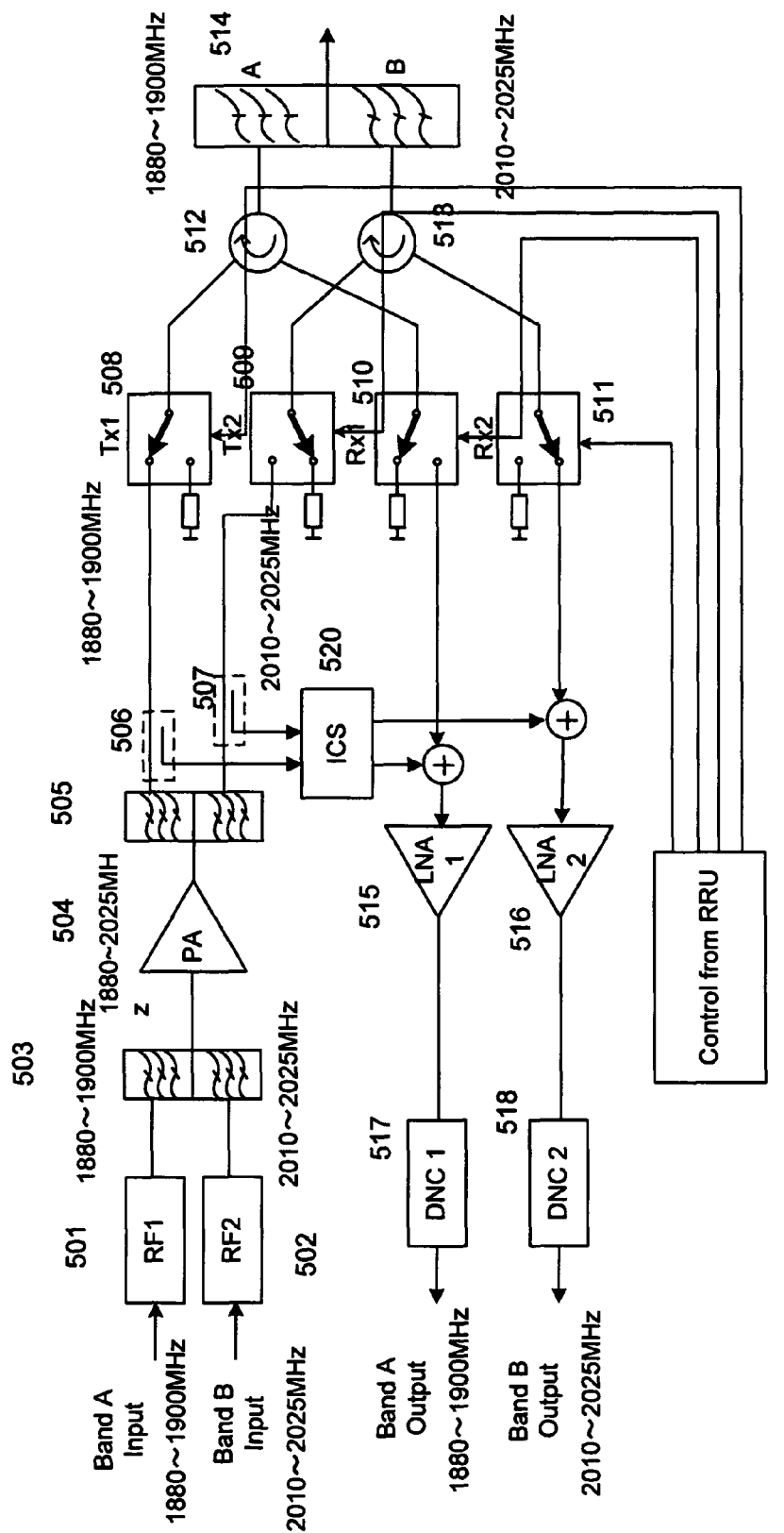
Figure 2: Dual Band TD-SCDMA RRU with Interference Cancellation System

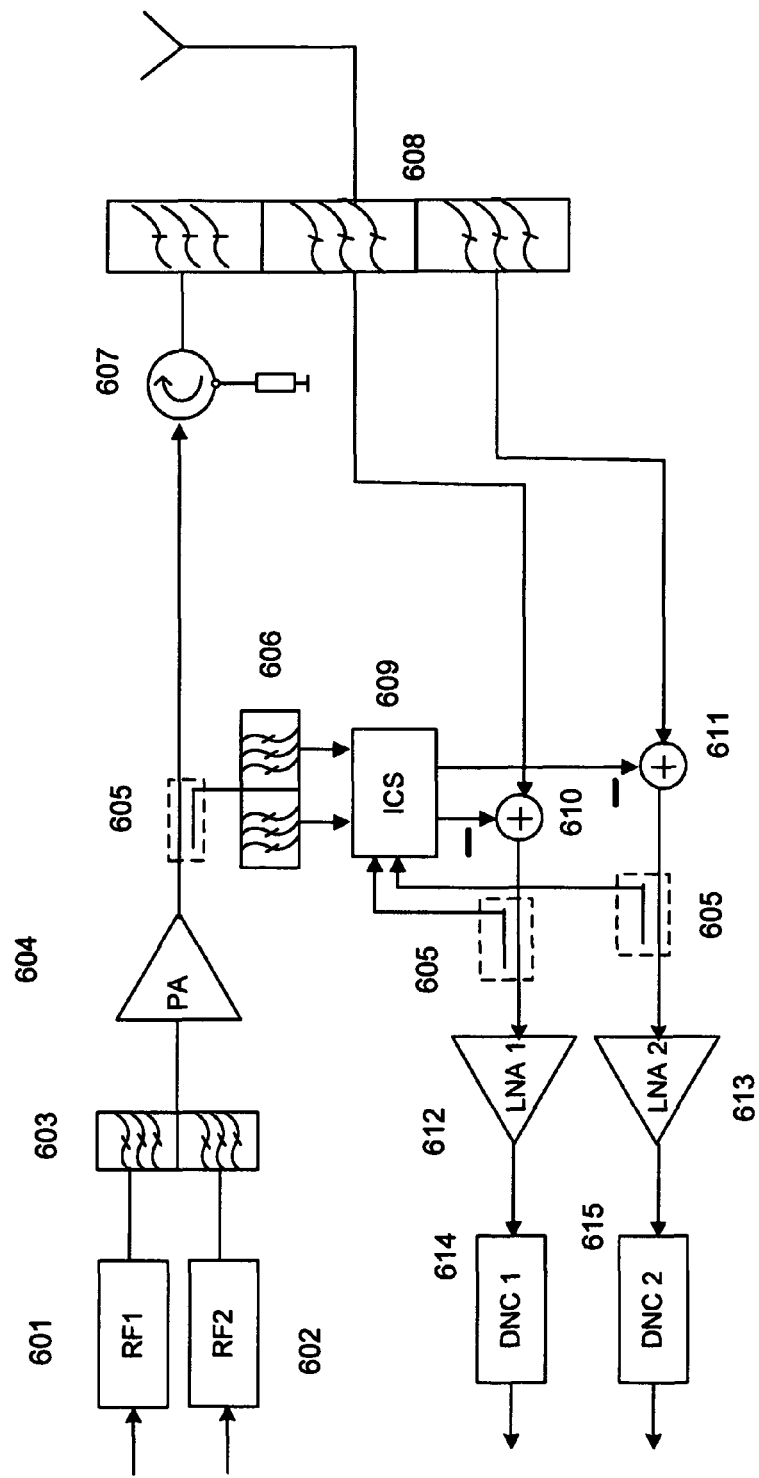
Figure 3: FDD Modulation Agnostic Dual Band RRU with Interference Cancellation System

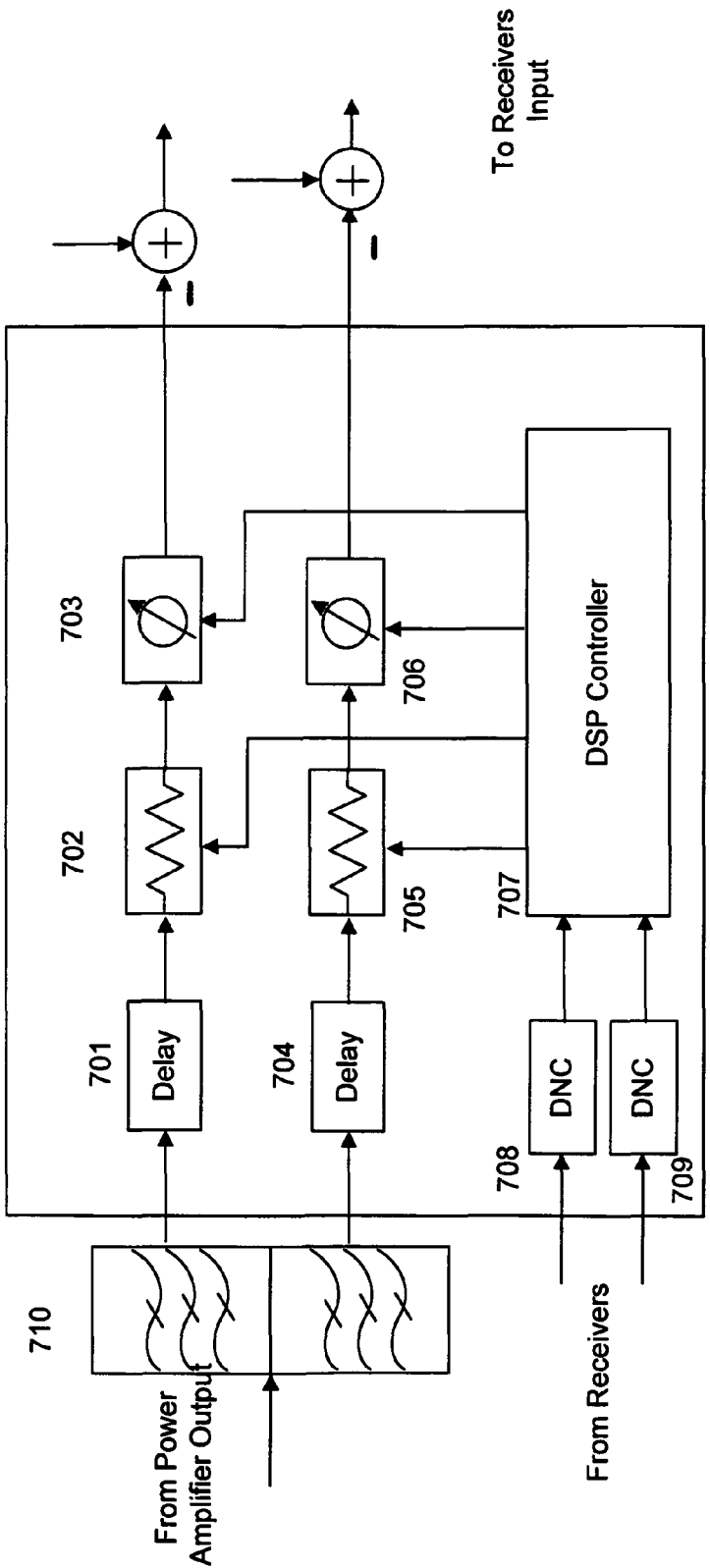
Figure 4: Dual-Band Interference Cancellation System using power detection

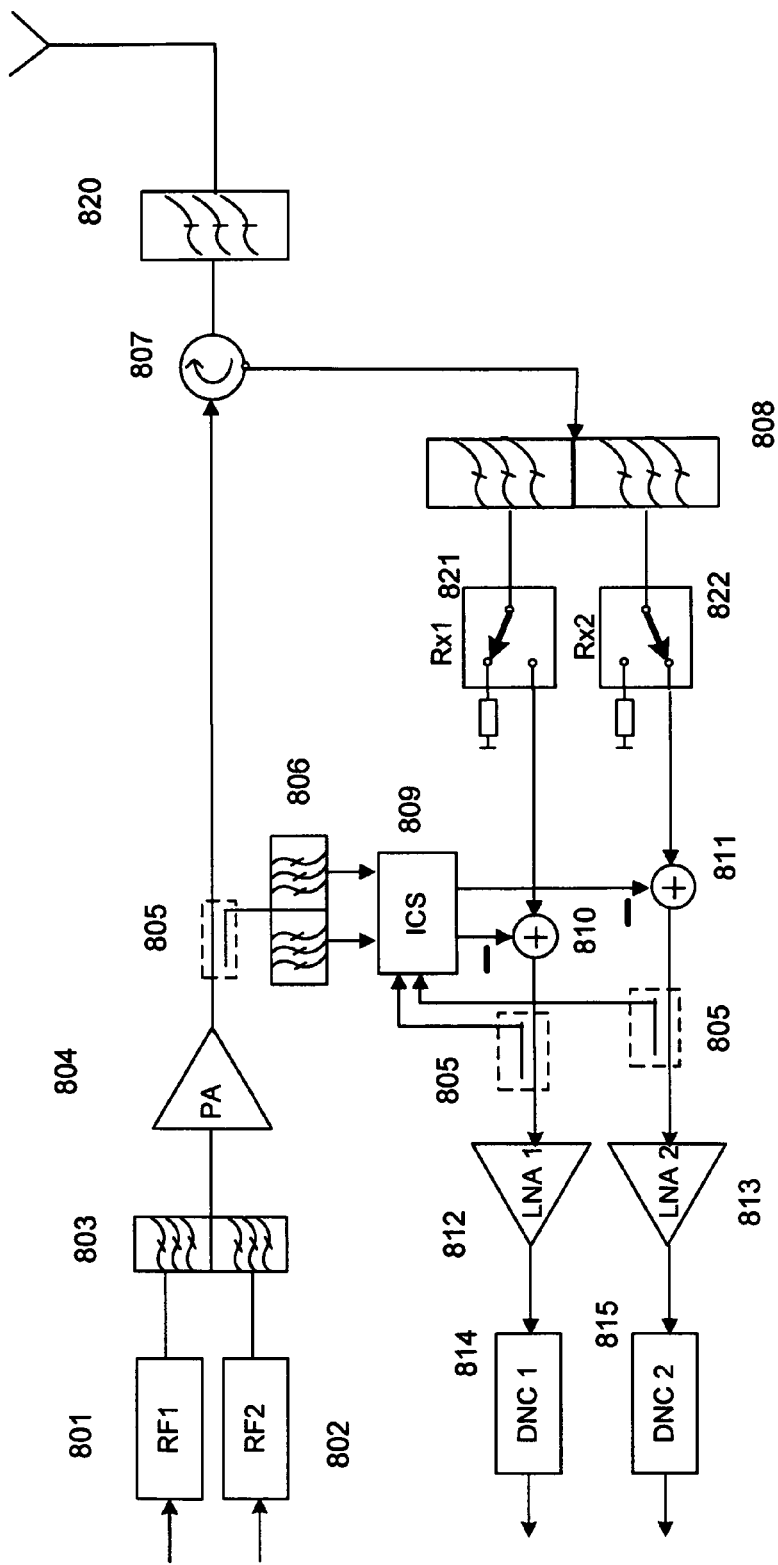
Figure 5: TDD Modulation Agnostic Dual Band RRU with Interference Cancellation System

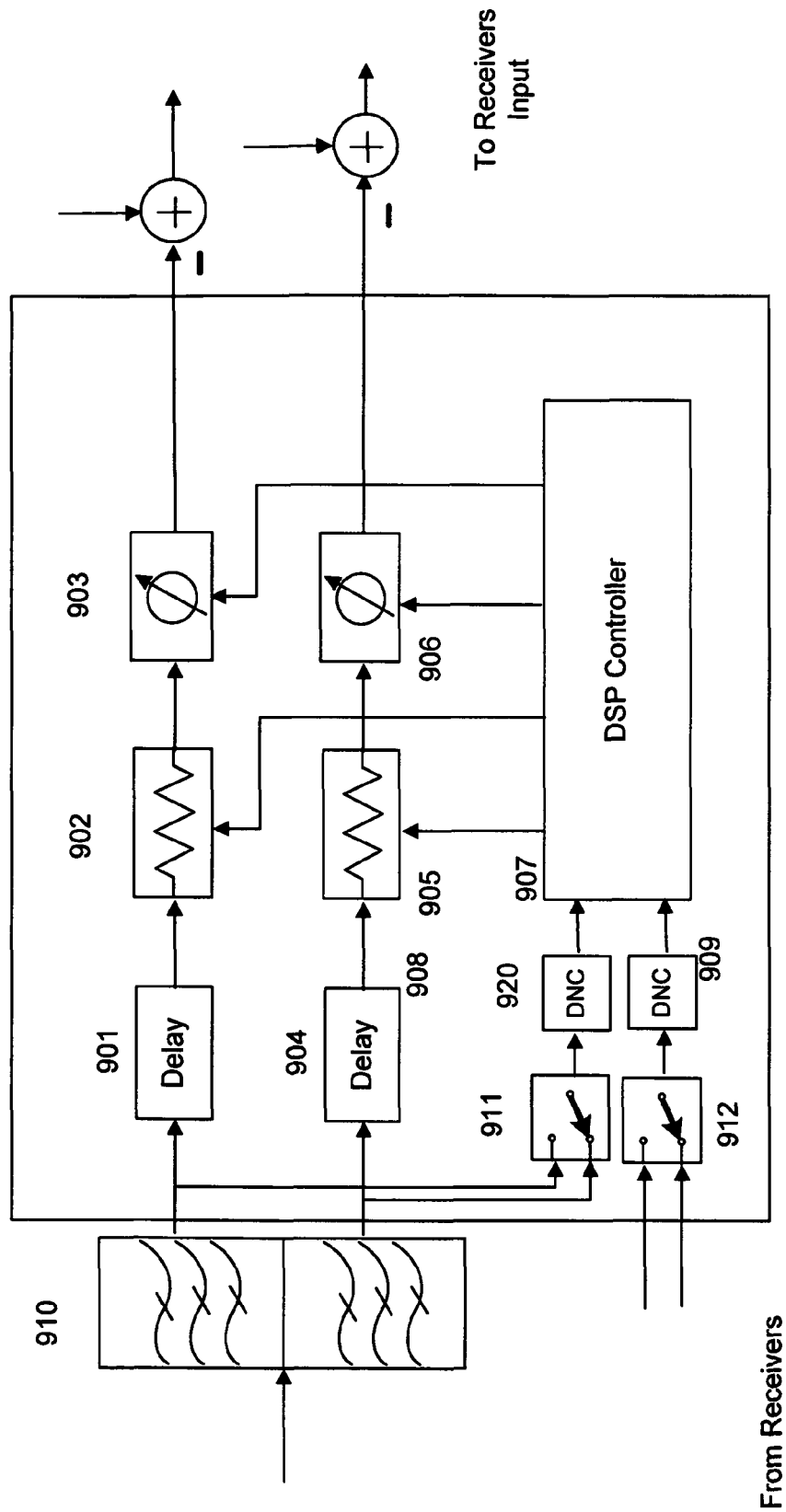
Figure 6: Dual-Band Interference Cancellation System using Correlation

REMOTE RADIO HEAD UNIT SYSTEM WITH WIDEBAND POWER AMPLIFIER AND METHOD

RELATED APPLICATIONS

This application claims the benefit of the applications: U.S. Patent Application Ser. No. 61/288,840, filed Dec. 21, 2009, entitled REMOTE RADIO HEAD UNIT SYSTEM WITH WIDEBAND POWER AMPLIFIER AND METHOD and naming as inventors Chengxun Wang and Shawn Patrick Stapleton, which is hereby incorporated by reference for all purposes.

FIELD OF THE INVENTION

The present invention generally relates to wireless communication systems using power amplifiers and remote radio head units (RRU or RRH). More specifically, the present invention relates to RRU which are part of a distributed base station in which all radio-related functions are contained in a small single unit that can be deployed in a location remote from the main unit.

BACKGROUND OF THE INVENTION

Wireless and mobile network operators face the continuing challenge of building networks that effectively manage high data-traffic growth rates. Mobility and an increased level of multimedia content for end users require end-to-end network adaptations that support both new services and the increased demand for broadband and flat-rate Internet access. In addition, network operators must consider the most cost-effective solutions to expand network capacity and evolution towards 4G and beyond.

Wireless and mobile technology standards are evolving towards higher bandwidth requirements for both peak rates and cell throughput growth. The latest standards supporting this are HSPA+, WiMAX, TD-SCDMA and LTE. The network upgrades required to deploy networks based on these standards must balance the limited availability of new spectrum, leverage existing spectrum, and ensure operation of all desired standards. This all must take place at the same time during the transition phase, which usually spans many years.

Distributed open base station architecture concepts have evolved in parallel with the evolution of the standards to provide a flexible, cheaper, and more scalable modular environment for managing the radio access evolution. For example, the Open Base Station Architecture Initiative (OBSAI), the Common Public Radio Interface (CPRI), and the IR Interface standards introduced standardized interfaces separating the Base Station server and the remote radio head part of a base station by an optical fiber.

The RRU concept is a fundamental part of a state-of-the-art base station architecture. 2G/3G/4G base stations are typically connected to RRUs over optical fibers. Either CPRI, OBSAI or IR Interfaces may be used to carry data to the RRH to cover a three-sector cell. The RRU incorporates a large number of digital interfacing and processing functions. Traditionally, a multi-channel RRU means that multiple antennas are used, typically with two power amplifiers for two distinct bands. A duplexer is used to combine the two power amplifier outputs. Switches are used to isolate the transmit signals from the received signals as occurs in a Time Division Synchronous Code Division Multiple Access (TD-SCDMA) modulation. To extent the prior art architecture to multiple bands (i.e., two or more bands) implementation would consist of adding additional channelized power amplifiers in parallel. The output of the additional power amplifiers is typically combined in an N by 1 duplexer and fed to a single antenna.

While conventional RRU architecture offers some benefits, RRUs to date are power-inefficient, costly and inflexible. Further, their poor DC-to-RF power conversion insures that they will have a large mechanical housing. In addition, current RRU designs are inflexible. As standards evolve, there is a need for multi-band RRUs that can accommodate two or more operating channels using a single wideband power amplifier. This creates an isolation problem at the individual receivers because the wideband power amplifier is always turned on. Isolation between the wideband transmitter and receivers is a problem with any modulation standard (HSPA+, WiMAX, LTE, etc.) when multi-band RRUs are developed using a single power amplifier This is a common problem for all communication systems that utilize a wideband power amplifier in a multi-band scenario.

SUMMARY OF THE INVENTION

Accordingly, the present invention has been made in view of the above problems, and it is an object of the present invention to provide a high performance and cost effective technique for implementing RRU systems that service multi-frequency bands. Further, the present disclosure enables a RRU to be field-reconfigurable, and supports multi-modulation schemes (modulation agnostic), multi-carriers, multi-frequency bands, and multi-channels. The present invention also serves multi-frequency bands within a single RRU to economize the cost of radio network deployment. In particular, the present invention resolves an isolation issue for a RRU with fewer power amplifiers than the number of operating frequency bands. Multi-mode radios capable of operating according to GSM, HSPA, LTE, TD-SCDMA and WiMAX standards and advanced software configurability are key features in the deployment of more flexible and energy-efficient radio networks.

The present invention achieves the above objects using techniques generally based on methods and techniques for maximizing the isolation between the transmitted signal (Tx Signal) and the received signal (Rx Signal). The Tx Signal may comprise noise generated at the output of the power amplifier or it may comprise an unwanted transmitter band leaking into the receiver. With the use of the present invention, conventional RRU's can be extended to a multi-band and multi-channel configuration. Multi-band means that more than one frequency bands are used in the RRU and multi-channel means that more than one output antenna is used. Various embodiments of the invention are disclosed.

An embodiment of the present invention utilizes duplexers, switches and circulators to maximize the isolation between the transmitter and receiver. Another embodiment of the present invention utilizes an Interference Cancellation System (ICS) together with duplexers, switches and circulators.

Applications of the present invention are suitable for use with all wireless base-stations, remote radio heads, distributed base stations, distributed antenna systems, access points, repeaters, mobile equipment and wireless terminals, portable wireless devices, and other wireless communication systems such as microwave and satellite communications. The present invention is also field upgradable through a link such as an Ethernet connection to a remote computing center.

THE FIGURES

Further objects and advantages of the present invention can be more fully understood from the following detailed description taken in conjunction with the accompanying drawings in which:

FIG. 1 is a block diagram of a TD-SCDMA dual-band single PA configuration in a remote radio head unit system in accordance with the present invention.

FIG. 2 is a block diagram of the TD-SCDMA dual-band single PA with a Interference Cancellation System (ICS) configuration in a remote radio head unit system in accordance with the present invention.

FIG. 3 is a FDD Modulation Agnostic Dual-Band Remote Radio Head with an Interference Cancellation System.

FIG. 4 is an Interference Cancellation System using Power Detection.

FIG. 5 is a TDD Modulation Agnostic Dual-Band Remote Radio Head with an Interference Cancellation System.

FIG. 6 is an Interference Cancellation System using Correlation.

| Glossary of Terms | |
|---|---|
| ACLR | Adjacent Channel Leakage Ratio |
| ACPR | Adjacent Channel Power Ratio |
| ADC | Analog to Digital Converter |
| AQDM | Analog Quadrature Demodulator |
| AQM | Analog Quadrature Modulator |
| AQDMC | Analog Quadrature Demodulator Corrector |
| AQMC | Analog Quadrature Modulator Corrector |
| BPF | Bandpass Filter |
| CDMA | Code Division Multiple Access |
| CFR | Crest Factor Reduction |
| DAC | Digital to Analog Converter |
| DET | Detector |
| DHMPA | Digital Hybrid Mode Power Amplifier |
| DDC | Digital Down Converter |
| DNC | Down Converter |
| DPA | Doherty Power Amplifier |
| DQDM | Digital Quadrature Demodulator |
| DQM | Digital Quadrature Modulator |
| DSP | Digital Signal Processing |
| DUC | Digital Up Converter |
| EER | Envelope Elimination and Restoration |
| EF | Envelope Following |
| ET | Envelope Tracking |
| EVM | Error Vector Magnitude |
| FFLPA | Feedforward Linear Power Amplifier |
| FIR | Finite Impulse Response |
| FPGA | Field-Programmable Gate Array |
| GSM | Global System for Mobile communications |
| I-Q | In-phase/Quadrature |
| IF | Intermediate Frequency |
| LINC | Linear Amplification using Nonlinear Components |
| LO | Local Oscillator |
| LPF | Low Pass Filter |
| MCPA | Multi-Carrier Power Amplifier |
| MDS | Multi-Directional Search |
| OFDM | Orthogonal Frequency Division Multiplexing |
| PA | Power Amplifier |
| PAPR | Peak-to-Average Power Ratio |
| PD | Digital Baseband Predistortion |
| PLL | Phase Locked Loop |
| QAM | Quadrature Amplitude Modulation |
| QPSK | Quadrature Phase Shift Keying |
| RF | Radio Frequency |
| RRU | Remote Radio Head Unit |
| SAW | Surface Acoustic Wave Filter |
| UMTS | Universal Mobile Telecommunications System |
| UPC | Up Converter |
| WCDMA | Wideband Code Division Multiple Access |
| WLAN | Wireless Local Area Network |

DETAILED DESCRIPTION OF THE INVENTION

The present invention is a novel RRU system that utilizes a wideband power amplifier. The present invention is a hybrid system of digital and analog modules. The interplay of the digital and analog modules of the hybrid system eliminates interference between the wideband power amplifier output and the receiver's inputs. The present invention, therefore, achieves higher Transmitter (Tx) to Receiver (Rx) isolation when using wideband power amplifiers with multiple frequency bands.

Referring first to FIG. 1, an embodiment of some aspects of the invention is shown in block diagram form. FIG. 1 depicts the analog section of a dual channel RRU. In this embodiment a single wideband power amplifier 404 is used. The two distinct frequency band signals are combined in a duplexer 403 and input to the wideband power amplifier 404. The output of the wideband power amplifier 404 is sent to a diplexer 405 in order to separate the two frequency band signals. This configuration enables the individual transmitter frequency bands to be independently turned-off. The Tx switches 405 and 407 are placed in the signal path after the diplexer 405. The signals are then passed through circulators 411 and 412 and a duplexer 413 in order to gain further isolation between the Tx signals and the Rx signals. The Rx switches 408 and 410 are placed on the third port of the circulator. Alternatively, two or more frequency bands can be combined in one power amplifier using the same architecture as in FIG. 1.

FIG. 2 illustrates a further alternative embodiment of the dual-band single wideband power amplifier RRU analog section. Although the embodiment in FIG. 2 shows a dual-band implementation, the invention can also be utilized in single band embodiments. In the embodiment of FIG. 2, an interference cancellation system (ICS) 520 is utilized to improve the isolation between the transmitter and receivers. The interference cancellation system generates a replica of the unwanted feedback signal but in anti-phase so as to eliminate the interference. The interference cancellation system comprises five primary blocks. Delay, variable attenuator, variable phase shifter, Down Converter (DNC) and DSP controller, alternative arrangements of which are shown in FIGS. 4 and 6, discussed hereinafter. The ICS receives incoming signals through links 506 and 507. The anti-phase output of the ICS is combined with the signals from switches Rx1 and Rx2, indicated at 510 and 511, respectively, by the use of adders 551 and 552, and the resulting signal provides the inputs to the LNA's 515 and 516. The ICS is an adaptive control system which continuously adjusts the variable attenuator as well as the variable phase shifter so as to maintain good interference cancellation. Alternatively, an embodiment of the ICS can comprise a fixed attenuator and phase shifter setting, eliminating the need for DSP control, although in at least some cases this results in inferior performance compared to the adaptive ICS system of FIG. 2. The remaining elements of FIG. 2 correspond to those shown in FIG. 1, and are indicated by the same numerals except that the most significant digit has been changed from "4" to "5".

FIG. 3 shows another embodiment of the analog section of a dual-band single wideband power amplifier RRU in Frequency Division Duplex (FDD) mode. This embodiment is modulation agnostic for FDD standard systems, and elements 601-604 operate analogously to elements 401-404 of FIG. 1. The triplexer 608 separates the transmitter bands from the receiver bands. FDD systems use different transmit and receive frequencies for each channel. The function of the triplexer 608 is to pass the output of power amplifier 604 to the antenna while isolating the receivers from the transmitter output. The ICS 609 system is utilized for increasing the isolation between the transmitter output and the receiver inputs as with FIG. 2, and receives the output of PA 604 through link 605. The output of the ICS 609 is combined with the appropriate triplexer outputs through adders 610 and 611, and the links 605 feeding the LNA's 612 and 613.

FIG. 4 is a depiction of one embodiment of an Interference Cancellation System (ICS). The function of the ICS is to generate a replicate of the interfering signal and place it in anti-phase to the interference, thereby eliminating the interfering signal. The input to the ICS system is a sample of the power amplifier output. Coupler 605 is used to sample the power amplifier output. The power amplifier's output is sampled and sent to a diplexer 710. This separates the two frequencies into distinct sections. The delay block 701 time-aligns the feedback interfering signal with the sampled power amplifier output. The variable attenuator 702 is adjusted to insure that the interfering signal and the sampled signal have equal magnitude. The variable phase shifter 703 is adjusted to insure that the interfering signal and the sampled signal are in anti-phase. A Digital Signal Processor (DSP) 707 or Microprocessor is used to control the attenuator and phase shifter. A power detection based adaptive algorithm in the DSP continuously monitors the signal at the Down Converter (DNC) 708 output and minimizes the level of the interference based on the detected power level. The power level of the interference is measured at the receiver while that band is in the transmit mode of operation. The second band is similarly processed using elements 704, 705 and 706.

FIG. 5 shows an embodiment of the analog section of a dual-band single wideband power amplifier RRU in Time Division Duplex (TDD) mode. This embodiment is modulation agnostic for TDD standard systems. The output of wideband power amplifier 804 feeds a circulator 807. The circulator provides some isolation between the transmitted signals and the receiver inputs. A multi-band filter 820 is placed between the circulator and the output antenna in order to attenuate out-of-band emissions. The third port of the circulator 807 is delivered to a diplexer 808, which separates the two distinct operating bands. TDD mode requires the transmitter and receiver to operate using the same frequency band at distinct times. In order to provide isolation between the transmitter and receiver, switches 821, 822 are used. The switches can provide some isolation but additional isolation may be required depending on the system specifications. The ICS 809 can provide additional isolation between the transmitter output and the receiver inputs in the manner described above.

FIG. 6 is a depiction of another embodiment of an Interference Cancellation System (ICS). The function of the ICS is to generate a replicate of the interfering signal and place it in anti-phase to the interference, thereby eliminating the interfering signal. The input to the ICS system is a sample of the power amplifier output. The power amplifier's output is sampled and sent to a diplexer 910. This separates the two frequencies into distinct sections. The delay block 901 time aligns the feedback interfering signal with the sampled power amplifier output. The variable attenuator 902 is adjusted to insure that the interfering signal and the sampled signal have equal magnitude. The variable phase shifter 903 is adjusted to insure that the interfering signal and the sampled signal are in anti-phase. A Digital Signal Processor (DSP) 907 or Microprocessor is used to control the attenuator and phase shifter. A correlation-based adaptive algorithm in the DSP is used to minimize the level of interference. The DSP correlates the two signals by controlling the output of switch 911 and the output of switch 912 after the signals have been translated to baseband using the two Downconverters 920 and 909. The switches 911 and 912 alternate between the two channels. The objective of the algorithm is to minimize the correlation between the sampled power amplifier output and the interference at the receiver. The computed correlation coefficient is used as the error function in an adaptive algorithm such as a Least Mean Squared (LMS) algorithm.

From the foregoing teachings, those skilled in the art will appreciate that the RRU system of the present invention enables the use of single wideband power amplifier for multi-band operation, which consequently saves hardware resources and reduces costs. The RRU system is also reconfigurable and field-programmable since the algorithms can be adjusted like software in the digital processor at anytime.

Moreover, the RRU system is agnostic to modulation schemes such as QPSK, QAM, OFDM, etc. in CDMA, TD-SCDMA, GSM, WCDMA, CDMA2000, and wireless LAN systems. This means that the RRU system is capable of supporting multi-modulation schemes, multi-frequency bands and multi-channels.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. An interference mitigation system for improving isolation between transmitters and receivers in wireless communications systems comprising:
   a power amplifier that amplifies a transmit signal that is transmitted by the system;
   a feedback coupler that generates a feedback signal based on the amplified transmit signal, wherein the feedback signal is representative of an interference characteristic attributed to the amplified transmit signal,
   an interference cancellation unit that:
      monitors the interference characteristic;
      adjusts an interference-reduction variable based on the interference characteristic;
      processes the feedback signal in accordance with the interference-reduction variable to generate a processed signal; and
   a combiner that combines an intake signal received from a receiver and the processed signal to generate a combined signal, wherein the intake signal includes a first component from a signal and a second component from interference from the transmit signal; and
   a switch that changes its position from a first position to a second position at times corresponding to a time-division duplexing technique, wherein the intake signal is combined with the processed signal while the switch is in the second position.

2. The interference mitigation system of claim 1, wherein the interference cancellation unit includes a delay block, an attenuator and a phase shifter.

3. The interference mitigation system of claim 1, further comprising switch-operating logic that controls the position of the switch.

4. The interference mitigation system of claim 1, further comprising a second switch that changes its position at times corresponding to the time-division duplexing technique.

5. The interference mitigation system of claim 1, further comprising a multiplexer that isolates each of a plurality of frequency bands within the amplified transmit signal, wherein the amplified transmit signal processed by the interference cancellation unit includes an isolated frequency band of the amplified transmit signal.

6. The interference mitigation system of claim 1, further comprising a second feedback coupler for generating a second feedback signal based on the combined signal, wherein the second feedback signal is representative of the combined signal, wherein the interference cancellation unit further processes the second feedback signal to generate the processed signal.

7. The interference mitigation system of claim 6, wherein the interference cancellation unit processes the feedback signal and the second feedback signal using a correlation technique.

8. The interference mitigation system of claim 6, wherein the interference cancellation unit is comprised of a delay block, an attenuator and a phase shifter.

9. The interference mitigation system of claim 6, further comprising one or more switches and switch-operating logic that controls a position of each of the one or more switches, wherein the switch-operating logic causes switch changes to occur at times corresponding to a time-division duplexing technique.

10. The interference mitigation system of claim 6 further comprising a multiplexer that isolates each of a plurality of frequency bands within the amplified transmit signal, wherein the amplified transmit signal processed by the interference cancellation unit includes an isolated frequency band of the amplified transmit signal.

11. The interference mitigation system of claim 6, further comprising a circulator and duplexer that isolate the intake signal by isolating a Frequency Division Multiplexed signal.

12. The interference mitigation system of claim 6, wherein the intake signal corresponds to a signal received from a first antenna, and wherein the transmit signal is transmitted via a second antenna, and wherein the separate antennae enable the system to operate in Frequency Duplex Mode.

13. The interference mitigation system of claim 6, wherein the interference cancellation unit is comprised of a variable delay block, variable attenuator and variable phase shifter.

14. A method for improving isolation between transmitters and receivers in wireless communications systems, the method comprising:
   amplifying a transmit signal;
   transmitting the transmit signal;
   generating a feedback signal based on the amplified transmit signal, wherein the feedback signal is representative of an interference characteristic attributed to the amplified transmit signal; and
   monitoring the interference characteristic;
   adjusting an interference-reduction variable based on the interference characteristic;
   processing the feedback signal in accordance with the interference-reduction variable to generate a processed signal;
   combining an intake signal and the processed signal to generate a combined signal, wherein the intake signal includes a first component from a signal received by a receiver and a second component from interference from the transmit signal; and
   causing a position of a switch to change from a first position to a second position at times corresponding to a time-division duplexing technique, wherein the intake signal is combined with the processed signal while the switch is in the second position.

15. The method of claim 14, wherein the processing includes one or more of introducing a delay, attenuation and phase shift to the feedback signal.

16. The method of claim 14, further comprising causing a position of a second switch to change at times corresponding to the time-division duplexing technique.

17. The method of claim 14, further comprising isolating each of a plurality of frequency bands within the amplified transmit signal, wherein the amplified transmit signal being processed includes an isolated frequency band of the amplified transmit signal.

18. The method of claim 14, further comprising generating a second feedback signal based on the combined signal, wherein the second feedback signal is representative of the combined signal, and wherein the feedback signal is processed with the second feedback signal to generate the processed signal.

19. The method of claim 18, wherein the feedback signal and the second feedback signal are processed using a correlation technique.

* * * * *